(12) United States Patent
Eisner (10) Patent No.: US 8,421,039 B2
(45) Date of Patent: Apr. 16, 2013

(54) METHOD AND APPARATUS FOR IMPROVED UNIFORMITY CONTROL WITH DYNAMIC BEAM SHAPING

(75) Inventor: Edward C. Eisner, Lexington, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 74 days.

(21) Appl. No.: 13/077,329

(22) Filed: Mar. 31, 2011

(65) Prior Publication Data

US 2012/0248324 A1 Oct. 4, 2012

(51) Int. Cl.
*G21K 5/10* (2006.01)
*H01J 3/12* (2006.01)

(52) U.S. Cl.
USPC ............. 250/492.21; 250/492.2; 250/492.22

(58) Field of Classification Search ............. 250/492.2, 250/492.21, 492.23, 492.3
See application file for complete search history.

(56) References Cited

U.S. PATENT DOCUMENTS

| | | | |
|---|---|---|---|
| 4,283,631 A | 8/1981 | Turner | |
| 4,736,107 A | 4/1988 | Myron | |
| 5,099,130 A | 3/1992 | Aitken | |
| 6,908,836 B2 | 6/2005 | Murrell et al. | |
| 7,176,470 B1* | 2/2007 | Evans et al. | 250/492.21 |
| 7,498,590 B2 | 3/2009 | Dzengeleski | |
| 2004/0232350 A1 | 11/2004 | Iwasawa et al. | |
| 2005/0189500 A1* | 9/2005 | Graf et al. | 250/492.21 |
| 2005/0253089 A1* | 11/2005 | Maeno et al. | 250/491.1 |
| 2005/0269527 A1* | 12/2005 | Murrell et al. | 250/492.21 |
| 2006/0017017 A1 | 1/2006 | Itokawa et al. | |
| 2008/0067436 A1 | 3/2008 | Vanderberg et al. | |
| 2008/0073575 A1* | 3/2008 | Dzengeleski | 250/492.21 |
| 2008/0078955 A1 | 4/2008 | Gaf et al. | |
| 2011/0086500 A1* | 4/2011 | Yoneda et al. | 438/514 |

OTHER PUBLICATIONS

Non-Final Office Action dated Jul. 10, 2012 for U.S. Appl. No. 13/077,112. 27 Pages.
Office Action issued on Dec. 5, 2011 in connection with U.S. Appl. No. 12/826,050.
Final Office Action issued Mar. 22, 2012 in connection with the U.S. Appl. No. 12/826,050.
U.S. Appl. No. 12/826,050, filed Jun. 29, 2010.
U.S. Appl. No. 13/077,112, filed Mar. 31, 2011.
Notice of allowance dated Oct. 29, 2012 for U.S. Appl. No. 13/077,112.

* cited by examiner

*Primary Examiner* — Robert Kim
*Assistant Examiner* — David E Smith
(74) *Attorney, Agent, or Firm* — Eschweiler & Associates, LLC (57) ABSTRACT

The present invention relates to a method and apparatus for varying the cross-sectional shape of an ion beam, as the ion beam is scanned over the surface of a workpiece, to generate a time-averaged ion beam having an improved ion beam current profile uniformity. In one embodiment, the cross-sectional shape of an ion beam is varied as the ion beam moves across the surface of the workpiece. The different cross-sectional shapes of the ion beam respectively have different beam profiles (e.g., having peaks at different locations along the beam profile), so that rapidly changing the cross-sectional shape of the ion beam results in a smoothing of the beam current profile (e.g., reduction of peaks associated with individual beam profiles) that the workpiece is exposed to. The resulting smoothed beam current profile provides for improved uniformity of the beam current and improved workpiece dose uniformity.

11 Claims, 8 Drawing Sheets

METHOD AND APPARATUS FOR IMPROVED UNIFORMITY CONTROL WITH DYNAMIC BEAM SHAPING

FIELD

The present disclosure relates generally to ion implantation systems, and more particularly to a system and method for improving dose uniformity and productivity of an ion beam implantation system

BACKGROUND

Ion implantation is a physical process that is employed in semiconductor apparatus fabrication to selectively implant dopants into a semiconductor workpiece and/or wafer. Ion implantation can be performed in various ways in order to obtain a particular characteristic on or within a substrate (e.g., such as limiting a diffusivity of a dielectric layer on the substrate by implanting a specific type of ion).

In a typical serial implantation process an ion beam may either be scanned across a single axis of a workpiece moving in the orthogonal direction, or alternatively a workpiece may be moved along a pair of orthogonal axes with respect to a stationary ion beam.

Figure 1:
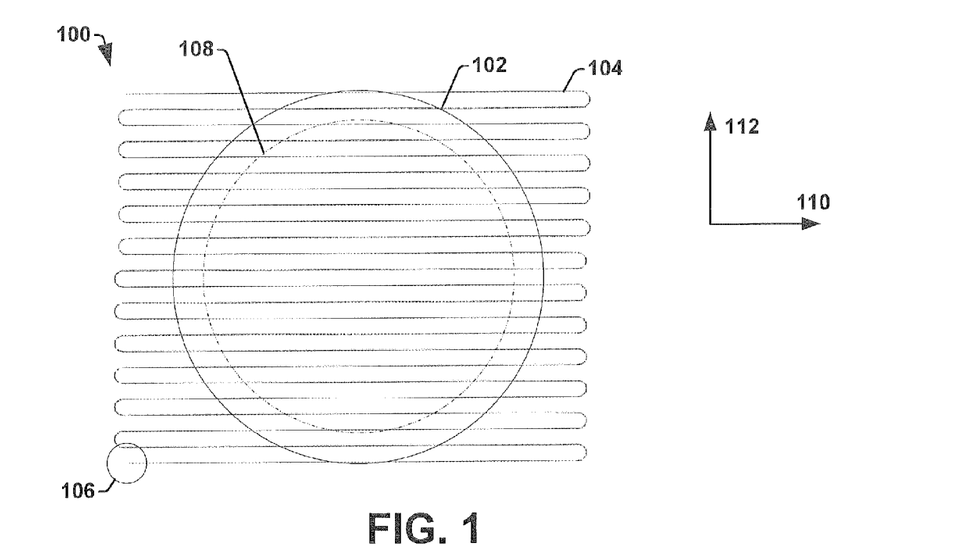
FIG. 1 illustrates a plan view of an exemplary ion beam path, viewed from the trajectory of the ion beam, as the ion beam scans over a workpiece during an implantation process.

FIG. 1 illustrates a plan view of an exemplary ion beam path 100 scanned along orthogonal axes, viewed from the trajectory of the ion beam, as the ion beam 106 scans over a workpiece 102 during an implantation process. In particular, during the implantation process the ion beam 106 may be focused at a spot while a moveable stage 108, holding the workpiece, is operable to translate the workpiece 102 along a path 104 having a fast scan axis 110 and a generally orthogonal slow scan axis 112. In general, a speed that a workpiece is moved along the fast scan axis 110 (also referred to as the "fast scan direction") is significantly faster than a speed that the workpiece is moved along the slow scan axis 112 (also referred to as the "slow scan direction").

SUMMARY

The following presents a simplified summary in order to provide a basic understanding of one or more aspects of the disclosure. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to the more detailed description that is presented later.

The present disclosure is directed towards a method and apparatus for varying the beam current density of an ion beam as the ion beam is scanned over the surface of a workpiece (e.g., a semiconducting wafer) to generate a time-averaged ion beam having an improved ion beam current profile uniformity that will result in improved dopant uniformity in the workpiece. In one embodiment, an ion implantation system comprising a beamline is configured to direct an ion beam toward an end station configured to hold a workpiece. During implantation, a scanning system moves the end station past the ion beam in a two-dimensional fashion comprising a fast scan direction and a slow scan direction (e.g., perpendicular to the fast scan direction). A beam focusing apparatus is configured to vary (e.g., continuously vary) the beam current density (e.g., the cross-sectional shape) of the ion beam, to obtain a plurality of different ion beam current densities respectively having different beam current profiles, as the ion beam moves across the surface of the workpiece. Since the different beam current densities of the ion beam respectively comprise different beam profiles (e.g., having peaks at different locations along the beam profile), rapidly changing the beam current density of the ion beam results in a smoothing of the beam current that the workpiece is exposed to (e.g., causing reduction of peaks associated with individual beam profiles). The resulting smoothed beam current profile provides for improved uniformity of the beam current and therefore improved workpiece dose uniformity.

To the accomplishment of the foregoing and related ends, the following description and annexed drawings set forth in detail certain illustrative aspects and implementations of the disclosure. These are indicative of but a few of the various ways in which the principles of the disclosure may be employed. Other aspects, advantages and novel features of the disclosure will become apparent from the following detailed description of the disclosure when considered in conjunction with the drawings.

DETAILED DESCRIPTION

The disclosure will now be described with reference to the drawings wherein like reference numerals are used to refer to like elements throughout. The illustrations and following descriptions are exemplary in nature, and not limiting. Thus, it will be appreciated that variants of the illustrated systems and methods and other such implementations apart from those illustrated herein are deemed as falling within the scope of the present disclosure and the appended claims.

As provided herein, the phrase "change in beam current density" is a non-limiting phrase that is meant to encompass any change in the beam current density or beam shape of the ion beam (e.g., a change from a beam current having a sharp peak with broad tail to a more Gaussian shape, wherein both beam currents are within a shape of the "edge" of the beam and are either the same size as measured by the contour containing, for example, 90% of the beam current, or different size) as being within the inventive concept.

In ion implantation, the desired dose distribution is usually prescribed on a workpiece to high accuracy. Therefore, for ion beams that are smaller than the workpiece in at least one dimension, a relative motion between the ion beam and the workpiece is used to provide a correct dosage to the workpiece. Dose uniformity control may typically be achieved by carefully adjusting both the speed of the relative motion and the path of the ion beam and/or workpiece. In cases where the relative motion is slow and the ion beam does not make many passes over a given point on the workpiece, the dose uniformity can be quite dependent on the exact current distribution of the ion beam. Several methods have been developed to modulate or "dither" the beam position at a higher frequency than the fundamental relative motion of the beam, so as to smooth out sharp features in the beam current distribution to improve dose uniformity. However, in cases where the size of the ion beam substantially fills the beamline, it may not be possible to "dither" the beam position without losing a significant amount of current, and the resulting beam shapes may be "worse" than without dithering because of clipping on apertures. Also, it may not be possible to accommodate the larger beam size that results from dithering the position of the beam.

The inventor has appreciated that beam focusing elements (e.g., comprising a series of magnetic quadrupoles configured to focus an ion beam using magnetic fields) may be used to vary the beam current density (e.g., by varying the cross-sectional shape of an ion beam, using one or more beam focusing elements) as the ion beam is scanned across a workpiece to generate a time-averaged beam current profile having an improved ion beam current uniformity (e.g., having reduced peaks/spikes in the beam current). Accordingly, in one embodiment, a method and apparatus are provided herein to improve implanted dose uniformity of a workpiece through using beam focusing to vary the beam current density of an ion beam, to obtain a plurality of different ion beam current densities respectively having different beam current profiles, as the ion beam scans over the surface of a workpiece. Since changing the beam current density of the ion beam provides for an ion beam having a plurality of different instantaneous ion beam current profiles, continuously varying the ion beam current density at a high frequency causes the beam profile to change between the different beam profiles resulting in a time-averaging of the individual beam profiles. Generating a time-averaged beam profile reduces the magnitude of undesired features (e.g. spikes) present in each individual beam current profile, therefore resulting in a smoother overall beam current profile (e.g., by averaging out the spikes and other sharp features) and therefore increasing the uniformity of the beam current and the implanted dose on the workpiece.

Figure 2:
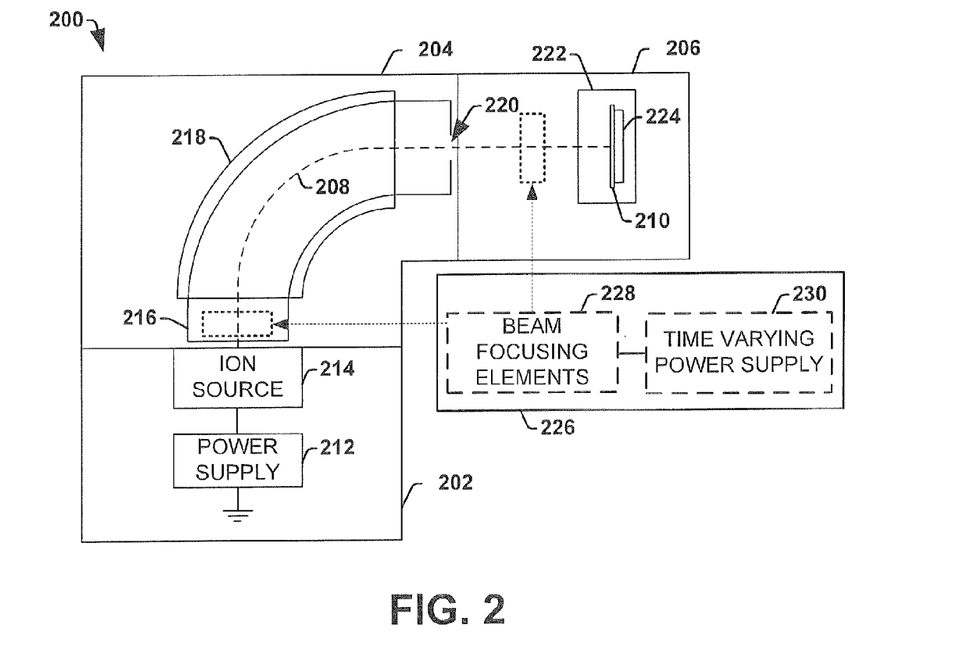
FIG. 2 is a system level diagram illustrating an ion implantation system having a beam focusing apparatus according to one embodiment of the invention.

Referring now to the figures, in accordance with one exemplary aspect of the present invention, FIG. 2 illustrates an exemplary ion implantation system 200, comprising a scanning system operable to mechanically scan a workpiece through the path of an ion beam, and having a beam focusing apparatus according to one embodiment of the invention. It will be appreciated that that various aspects of the present invention may be implemented in association with any type of ion implantation apparatus, including, but not limited to, the exemplary system of FIG. 2.

The ion implantation system 200 comprises a source terminal 202, a beamline assembly 204, and an end station 206 that forms a process chamber in which the ion beam 208 is directed to a workpiece 210 location. An ion source 214 in the source terminal 202 is powered by a power supply 212 to provide an extracted ion beam 208 to the beamline assembly 204, wherein the ion source 214 comprises one or more extraction electrodes (not shown) to extract ions from the source chamber and thereby to direct the extracted ion beam 208 toward the beamline assembly 204.

The beamline assembly 204 may comprise a beamguide 216 having an entrance near the ion source 214 and an exit with a resolving aperture 220, as well as a mass analyzer 218 that receives the extracted ion beam 208 and creates a dipole magnetic field to pass ions of appropriate mass-to-energy ratio or range thereof (e.g., a mass analyzed ion beam 208 having ions of a desired mass range). The beamguide 216 directs the mass-analyzed beam 208 through the resolving aperture 220 to the workpiece 210, which may be mounted on a movable stage 224 of a workpiece scanning system 222 associated with the end station 206.

The end station 206 illustrated in FIG. 2, comprises a "serial" type end station that provides an evacuated process chamber in which the workpiece 210 (e.g., a semiconductor wafer, display panel, or other substrate) is supported along the beam path for implantation with ions. According to one exemplary aspect of the present invention, the ion implantation system 200 provides a generally stationary ion beam 208 (e.g., also referred to as a "spot beam" or "pencil beam"), wherein the workpiece scanning system 222 generally translates the workpiece 210 (e.g., via the movable stage 224 holding or supporting the workpiece 210) in two generally orthogonal axes with respect to the stationary ion beam 208.

A beam focusing apparatus 226 is configured to vary (e.g., continuously vary) the beam current density (e.g., the cross-sectional shape) of the ion beam 208 in a time-varying manner to obtain a plurality of different instantaneous ion beam current densities, respectively having different beam current profiles, as the ion beam 208 moves across the surface of the workpiece 210 during implantation. Since changing the beam current density of the ion beam provides for an ion beam having a plurality of different instantaneous ion beam current profiles, continuously varying the ion beam current density at a high frequency causes the beam profile to change between the different beam profiles resulting in a time-averaging of the individual beam profiles, thereby increasing the uniformity of the beam current and the implanted dose.

It will be appreciated that the one or more beam focusing/shaping elements 228 may be located at any position along the beam line of the ion implantation system. For example, in various embodiments, the beam focusing apparatus 226 may comprise one or more beam focusing/shaping elements 228 located within the end station 206, the beam line assembly 204, and/or the terminal 202, and configured to effectuate changes in the beam current density of the ion beam 208 (e.g., configured to vary the focal properties of the ion beam) as the ion beam is transported to the workpiece 210. For example, in the embodiment illustrated in FIG. 2 the focusing/shaping elements 228 may be operatively coupled (e.g., reside within)

the end station 206. In alternative embodiments, the focusing/ shaping elements 228 may be operatively coupled to (e.g., reside within) a location upstream of the end station (e.g., be located anywhere along the beam line assembly 204 and/or the terminal 202).

In one embodiment, focusing/shaping elements 228 are operable to change the cross-sectional shape of the ion beam 208 as the scanning system 222 translates the workpiece 210 along the fast scan direction. Since the shape of the ion beam may be associated with a beam current density, changing the shape of the ion beam may vary the beam current density. Therefore, the beam focusing apparatus 226 provides for a change in cross-sectional shape of the ion beam that serves to average the beam profiles of individual cross-sectional shapes, thereby reducing the effect of any beam hot spots (e.g., spikes, peaks) associated within an individual (e.g., static) beam cross-sectional shape and accordingly improving beam dose uniformity across the workpiece 210.

For example, the beam focusing apparatus 226 may be configured to rapidly change the ion beam 208 from a cross-sectional shape that causes a beam current spike in the middle of the ion beam profile to another cross-sectional shape that does not cause a beam current spike in the middle of the ion beam profile, resulting in an ion beam having a time-averaged beam current density with a reduced magnitude of the beam current spike in the middle of the ion beam profile. Accordingly, rapidly changing the cross-sectional shape of the ion beam in a time varying manner, as an ion beam is scanned across a workpiece, results in an average ion beam current density having reduced current spikes.

In one embodiment, a time varying power supply 230 is coupled to the beam focusing/shaping elements and is configured to provide a time-varying signal (e.g., a time varying voltage, a time varying current) to drive operation of the beam focusing/shaping elements 228. In one particular embodiment, the time varying signal is provided to a beam focusing/ shaping elements 228, configured to operate beam focusing elements comprising a magnetic quadrupole, to generate a time varying magnetic field that acts upon the ion beam 208 causing it to change its beam current density in time (e.g., as it is scanned across the workpiece 210).

In one embodiment, the beam focusing apparatus 226 may be configured to iteratively adjust the focus of the ion beam until a predicted dose uniformity associated with the ion beam indicates a "better" beam uniformity than a predetermined implant uniformity criteria. In one embodiment a predicted dose uniformity of the implant may be calculated by the beam focusing apparatus from a measured beam current density profile, and compared to a predetermined implant uniformity criterion. If the predicted dose uniformity does not violate the predetermined implant uniformity criterion, then the implantation may proceed. However, if the predicted uniformity does violate the predetermined implant uniformity criterion, then the focusing apparatus 226 may be dynamically adjusted until the predicted uniformity does not violate the predetermined implant uniformity criteria.

For example, the beam focusing apparatus 226 may be configured to calculate a first predicted dose uniformity of the implant from a measured beam current density profile corresponding to a first static focusing value (e.g., corresponding to a signal magnitude provided to one or more beam focusing elements 226, correspond to a focusing strength of one or more beam focusing elements 226), and to compare the calculated first predicted dose uniformity to a predetermined implant uniformity criterion. If the calculated first predicted dose uniformity does not violate the predetermined implant uniformity criterion, then the implantation may proceed. However, if the calculated first predicted dose uniformity does violate the predetermined implant uniformity criterion, then the focusing apparatus 226 may be adjusted to a second static focusing value. The beam focusing apparatus 226 may then calculate a second predicted dose uniformity of the implant from a measured beam current density profile corresponding to the second static focusing value, and compare the calculated second predicted dose uniformity to the predetermined implant uniformity criterion. If the calculated second predicted uniformity does not violate the predetermined implant uniformity criterion, then the implantation may proceed. However, if the calculated second predicted uniformity does violate the predetermined implant uniformity criteria the focusing value of the beam focusing apparatus 226 may be set to dynamically vary its ion beam focus between the first and second static focusing values.

Figure 3A:
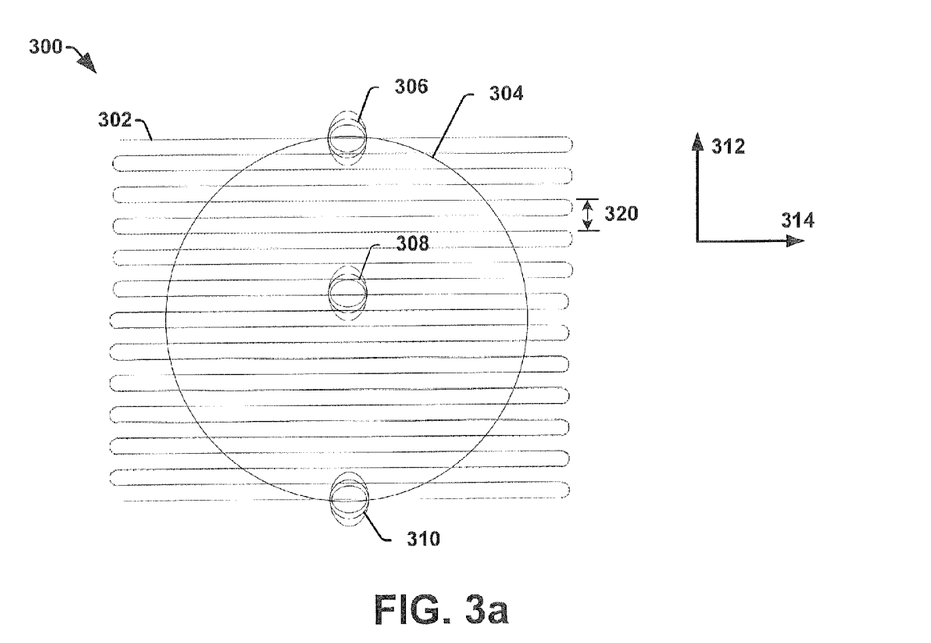
FIG. 3a is a plan view of an exemplary ion beam path, viewed from the trajectory of the ion beam, having an ion beam cross-sectional shape that is varied as the ion beam scans over a workpiece.
Figure 3B:
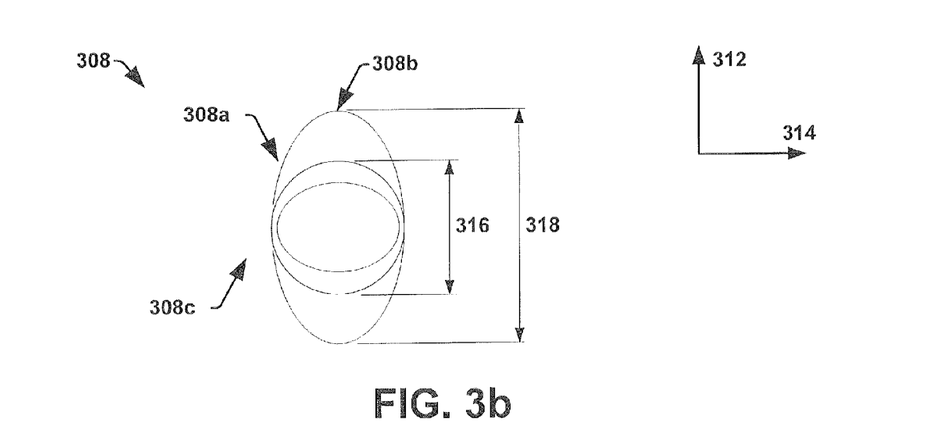
FIG. 3b is a phantom type diagram illustrating an ion beam having a changing cross-sectional shape resulting in a time-averaged beam current having an increased beam current uniformity over the profile of the beam.

FIGS. 3a and 3b more particularly illustrate changes to the beam current density that may occur due to exemplary changes in the cross-sectional shape of an ion beam, as the ion beam scans over the surface of a workpiece, so as to average the beam current density of individual cross-sectional shape current profiles and reduce the effect of ion beam hot spots. It will be appreciated that a change in the cross-sectional shape of an ion beam is one way in which the beam current density of an ion beam may be varied, though is not intended to be a limiting example of how beam current density may be varied. It will also be appreciated that the "change in cross-sectional shape" of an ion beam, as referred to herein, may comprise any change to the cross-sectional shape of an ion beam. For example, changing the cross-sectional shape of the beam may comprise making the ion beam larger, smaller, wider, or narrower.

FIG. 3a illustrates a plan view 300 of an exemplary ion beam path 302 scanned over a workpiece 304, viewed from the trajectory of the ion beam, showing variations in the cross-sectional shape of the ion beam at particular locations along the path 302. In particular, the ion beam is illustrated at three different exemplary locations 306, 308, 310, respectively representing a location of the ion beam with respect to the workpiece 304 at three different time periods. The ion beam at each of the three exemplary locations is illustrated in phantom, representing three example cross-sectional shapes of the ion beam as one or more beam focusing/shaping elements vary the ion beam cross-sectional shape during scanning.

As shown in FIG. 3a, changes in an ion beam's cross-sectional shape may occur in any direction or directions. In one embodiment, the beam focusing apparatus may vary the length and/or width of the ion beam. As described above, the change in the cross-sectional shape of the ion beam (e.g., through focal variation) results in a change in the beam current density to generate a time-averaging of the current of the ion beam (e.g., a time averaging of the beam current over the area of the three phantom circles, thereby essentially forming an extended elliptical shape), Further, while the scan speed of the fast scan along the fast scan axis 314 in one embodiment is a first scan frequency (e.g., 1-2 Hz), the beam focusing apparatus may be configured to change the cross-sectional shape of the ion beam at a second frequency that is substantially greater (e.g., 50-100 Hz) than the first frequency. For example, by setting the frequency of the cross-sectional shape variation at a frequency that is much greater than the beam/wafer scan frequency the change in beam profile will not produce coherent spatial structures in the implanted dose spatial distribution, but instead will have an overall smoothing effect on the beam current and an improvement of the implanted dose uniformity. In one embodiment, the ratio of the beam shape modulation frequency to the fast scan frequency is greater than 10.

In one embodiment, the cross-sectional shape of the ion beam may be varied along an axis having a different direction than the fast scan direction, thereby generating a time-averaged ion beam having a modified effective height. For example, extending the shape of the ion beam in a direction substantially parallel to the slow scan direction, allows for a time-averaged ion beam having a greater height which allows for a larger scan pitch and thus higher tool productivity, and/or an improvement in dose uniformity. This feature is best understood in conjunction with FIG. 3b, wherein a first beam shape 308a has a first dimension 316, while a second beam shape 308b has a second larger dimension 318, resulting in a time-averaged beam having an enlarged dimension along the slow scan direction 312. The larger effective beam shape in the slow scan direction 312 allows for a larger scan pitch 320 (FIG. 3a). Therefore, the method and apparatus provided herein may provide for either a reduced number of scan lines to fully scan the workpiece 304, or to provide improved dose uniformity at the same or slightly larger number of scan lines.

FIGS. 4a-4e illustrate the ion beam profile smoothing effect obtained by rapidly varying the cross-sectional shape of the ion beam as an ion beam is scanned over a workpiece (i.e., by generating a time averaged beam profile over a plurality of individual ion beam cross-sectional shape beam current profiles).

Figure 4A:
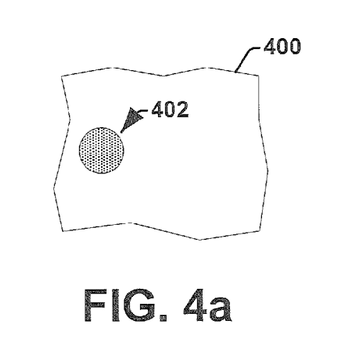
FIGS. 4a-4b illustrate cross-sectional ion beam shapes incident on a workpiece.
Figure 4B:
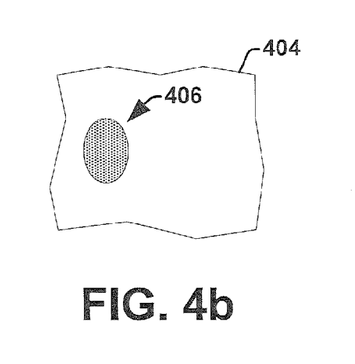
Figure 4C:
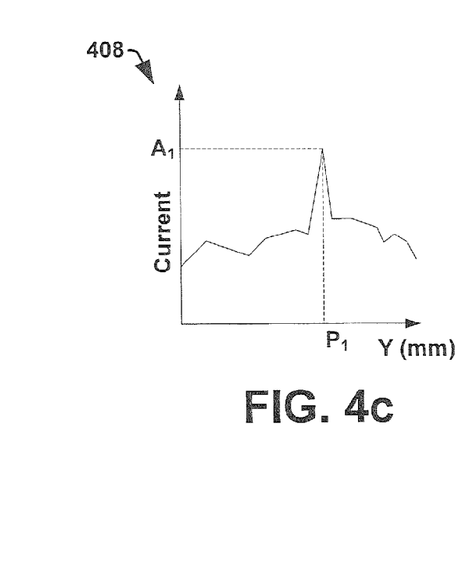
FIGS. 4c-4d illustrate ion beam profiles associated with the cross-sectional ion beam shapes of FIGS. 4a-4b, respectively.
Figure 4D:
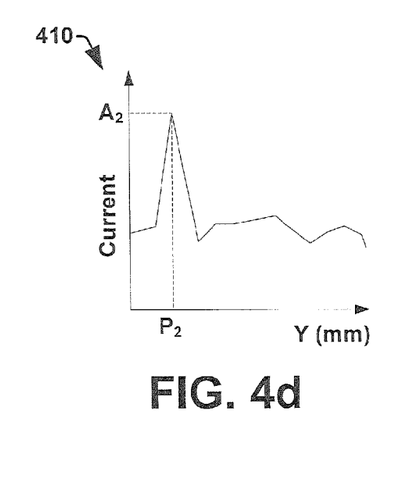

As stated above, changing the cross-sectional shape of an ion beam will provide a plurality of different instantaneous beam current densities having different beam profiles for the ion beam over time. For example, a first cross-sectional beam shape may have a first beam profile having a spike at a first location along the beam profile, while a second cross-sectional beam shape may have a second beam profile having a spike at a second location, different then the first location, along the beam profile. For example, FIG. 4a illustrates a first ion beam shape 402 incident on a workpiece 400. FIG. 4c illustrates a beam current profile 408, associated with the first ion beam shape 402, comprising a current peak/spike having an amplitude $A_1$ at a location $P_1$. FIG. 4b illustrates a second ion beam shape 406 incident on a workpiece 404. FIG. 4d illustrates a beam current profile 410, associated with the second ion beam shape 406, comprising a current peak/spike having an amplitude $A_2$ at a location $P_2$.

Figure 4E:
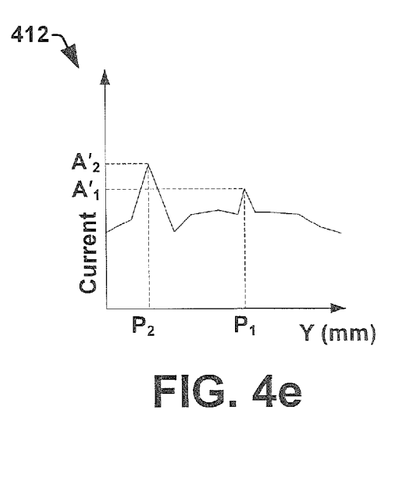
FIG. 4e illustrates a time averaged ion beam profile, comprising the time-average of the ion beam profiles shown in FIGS. 4c and 4d.

Rapidly changing the cross-sectional shape of an ion beam may cause the beam current density to change between different beam profiles resulting in a time-averaged beam profile that reduces spikes in the beam current profile (e.g., by averaging out the spikes and other sharp features). In other words, changing from an ion beam shape 402 having a current profile with a big spike in a first location $P_1$ to an ion beam shape 406 having a current profile with a big spike in a different location $P_2$, causes current spikes to be present at the different locations for a relatively short period of time, thereby reducing current spikes in the time-averaged beam current profile. For example, FIG. 4e illustrates a time-averaged beam current profile 412 having a time-average of the beam current profiles 408 and 410. The time-averaged beam current profile comprises a current peak/spike having an amplitude $A'_2$ at a location $P_2$, wherein $A'_2$ is smaller than $A_2$ and a current peak/spike having an amplitude $A'_1$ at a location $P_1$, wherein $A'_1$ is smaller than $A_1$.

Therefore, rapidly changing the cross-sectional shape of an ion beam the beam can expose a workpiece using a number of different beam current densities having beam current profiles. Although none of the individual beam shapes may provide a "good" beam current profile (e.g., with minimal current spikes), by changing rapidly from one beam current profile to another the workpiece is exposed to an average of the different beam current profiles therefore increasing the uniformity of the implanted dose provided by the ion beam. Accordingly, rapidly changing the cross-sectional shape of the ion beam as it scans over a workpiece produces an ion beam having a more desirable beam profile, than any of beam profiles produced by the individual shapes.

Figure 5:
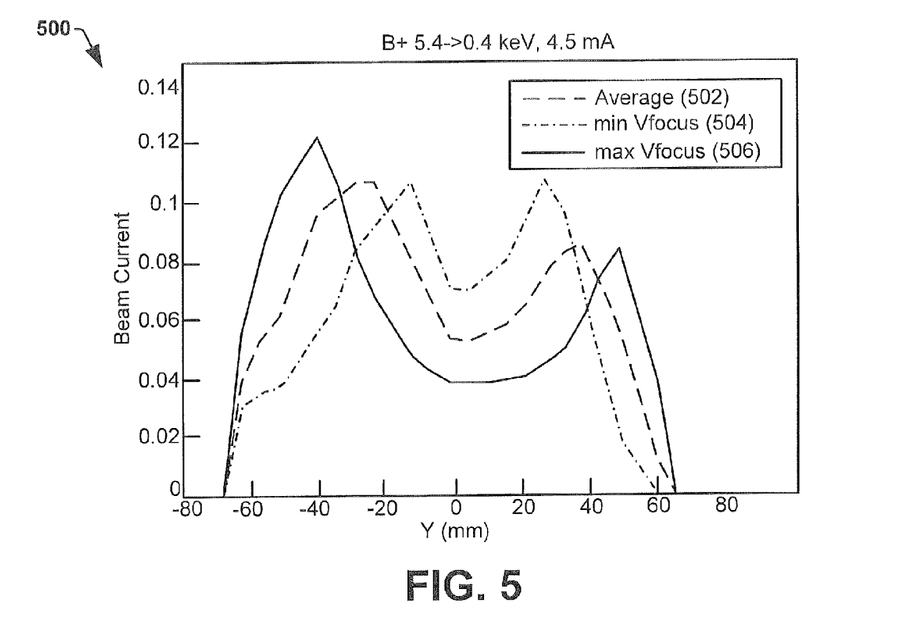
FIG. 5 is a graph showing a vertical beam profile, generated using an electrostatic quad, with different vertical focus electrode voltages, wherein the beam current is shown on the y-axis and the height of the ion beam is shown on the x-axis.

FIG. 5 is a graph 500 showing a vertical beam profile, generated using an electrostatic quadrupole, with different vertical focus electrode voltages (with the beam current shown on the y-axis and the height of the ion beam is shown on the x-axis). In particular, FIG. 5 illustrates the effect that varying the focusing strength of a focusing element may have on both the beam current density of the beam current profile and on the beam current of the ion beam.

For example, beam profile trend lines 504 and 506 illustrate the beam current of ion beams that are statically operated upon by the beam focusing apparatus. In particular, the graph illustrates a beam profile trend line 506 corresponding to a maximum voltage on tuning plates of the electrostatic quadrupole and a beam profile trend line 504 corresponding to a minimum voltage on tuning plates of the electrostatic quad. The peaks of the beam profiles corresponding to the maximum and minimum voltages individually provide peaks that are relatively sharp.

In comparison, beam profile trend line 502 illustrates a beam current profile of the ion beam that is dynamically operated upon by a beam focusing apparatus (e.g., that has its cross-sectional shape varied in time by the beam focusing apparatus from the maximum to a minimum voltage). The beam profile trend line 502 has an average beam current density with beam current spikes that are reduced from those generated by either of the individual static beam profiles.

It will be appreciated that the smoothing effect may be a function of the variation in focusing strength of the focusing elements. For example, the range of vertical focusing voltages used in the formation of graph 500 was small (e.g., +/−10%), thereby resulting a relatively small changes in the beam current density of the ion beam and therefore a relatively small smoothing effect on the beam current.

Figure 6:
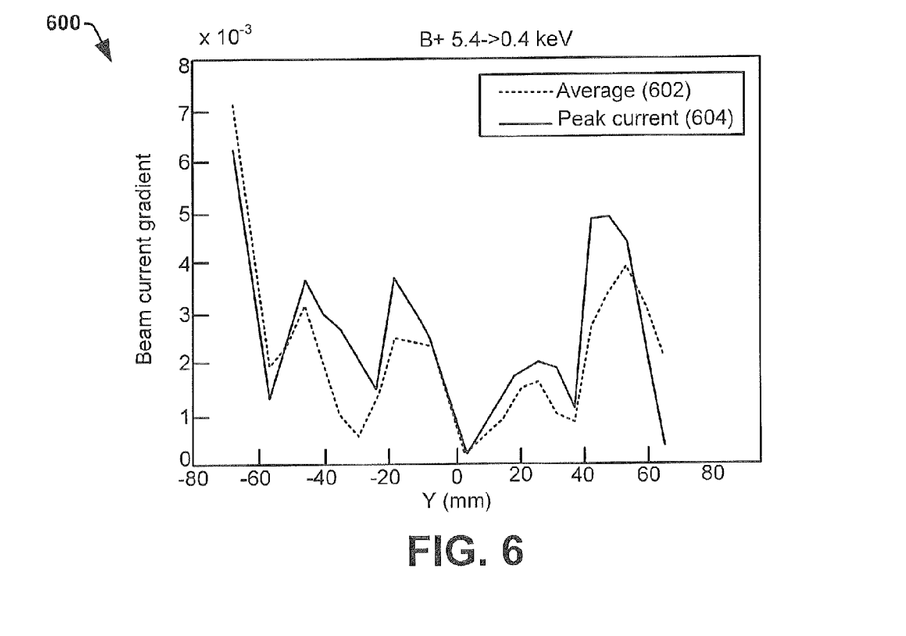
FIG. 6 is a graph showing a gradient of a beam profile, generated using an electrostatic quad, with different vertical focus electrode voltages, wherein the gradient of the beam current is shown on the y-axis and the height of the ion beam is shown on the x-axis.

FIG. 6 is a graph showing the gradient (i.e., slope) of the beam current profile 506, and the time-averaged beam current profile 502. Trend line 604 is the gradient of the ion beam profile for an electrostatic quadrupole having a maximum voltage on tuning plates (corresponding to beam current profile 506). Varying the beam current density of the ion beam results in trend line 602 (corresponding to beam current profile 502), in general having an average value that is below that of trend line 604 (e.g., rounding out the profile by averaging the beam current throughout the beam by changing the cross-sectional shape of the beam).

The beam focusing apparatus, as provided herein, may comprise any type of beam focusing elements operable to focus an ion beam as described above in conjunction with FIGS. 2-4. FIGS. 7a-7d illustrate various non-limiting embodiments of beam focusing elements that may be used to vary the beam current density of an ion beam as provided herein.

Figure 7A:
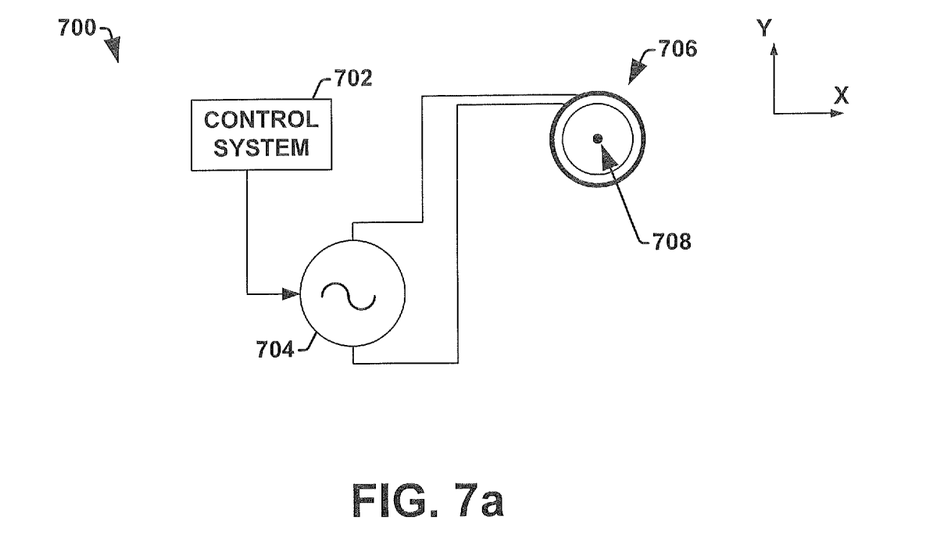
FIGS. 7a-7d illustrate various non-limiting embodiments of beam focusing elements that may be used to vary the cross-sectional shape of an ion beam as provided herein.

FIG. 7a illustrates one embodiment of an ion beam focusing apparatus 700 as provided herein, comprising a solenoid 706 having a plurality of windings encircling the ion beam 708. A time-varying power source 704 is coupled to the solenoid 706 to provide a time varying signal (e.g., voltage, current), which causes the solenoid 706 to generate a time varying magnetic field.

Figure 7B:
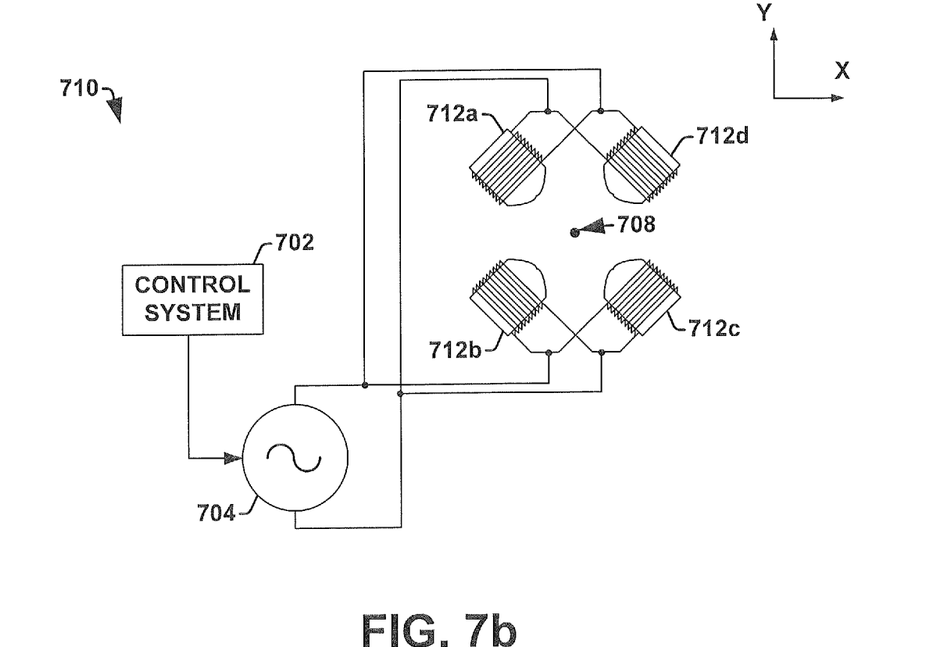

FIG. 7b illustrates an alternative embodiment of an ion beam focusing apparatus 710, as provided herein, comprising a quadrupole magnet having four electromagnets 712a-712d disposed around the ion beam line. A time-varying power source 704 is coupled to the electromagnets 712a-712d and is configured to provide a time varying signal (e.g., voltage, current) that causes the electromagnets 712a-712d to produce one or more time varying magnetic fields that act upon an ion beam to vary its beam current density as it scans across a workpiece. Although a quadrupole magnet having four electromagnets is shown in FIG. 7b, it will be appreciated that a multipole magnet having multiple electromagnets may also be used as a beam focusing apparatus.

Figure 7C:
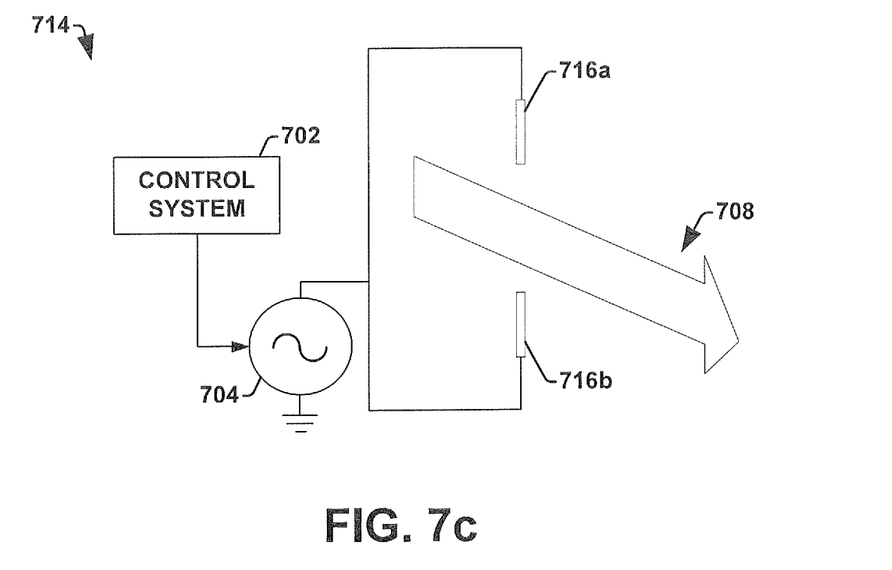

FIG. 7c illustrates an alternative embodiment of an ion beam focusing apparatus 714, as provided herein, comprising a suppression electrode having a pair of conductive focus adjustment electrodes or plates 716a and 716b positioned on either lateral side of the ion beam 708, and which extend substantially parallel to the beam path. A time varying power source 704 is coupled with the electrodes 716a and 716b, and is configured to provide a time-varying (e.g., common mode) potential to the focus adjustment electrodes, thereby generating time-varying electric fields between the plates 716a and 716b and surrounding structures (not shown), which vary the beam current density as it scans across a workpiece.

Figure 7D:
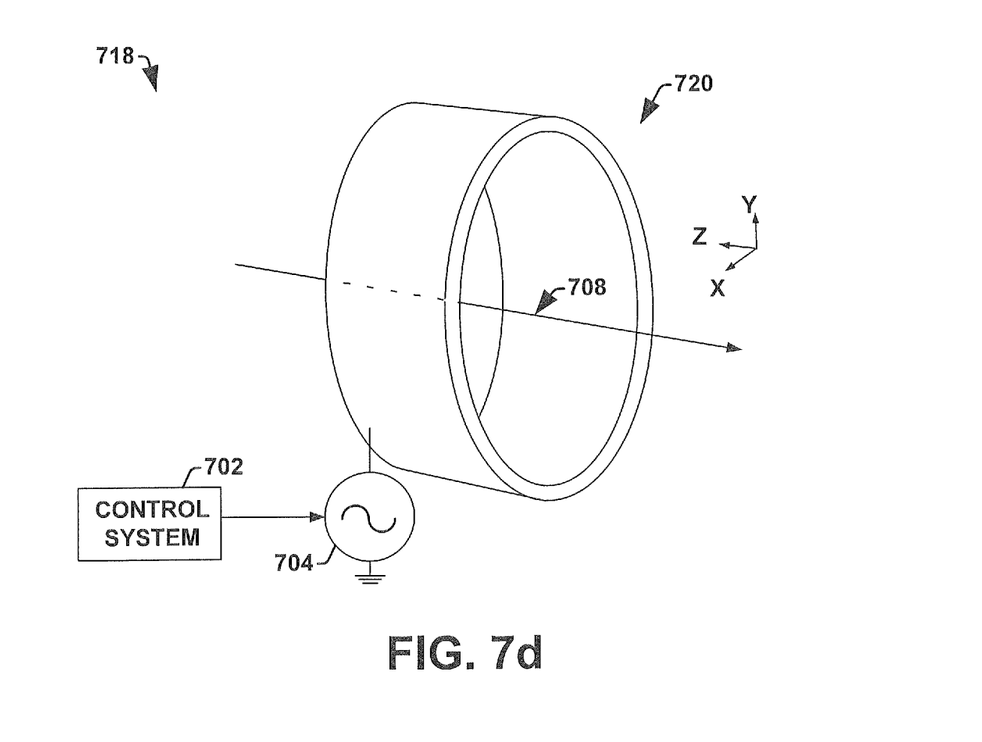

FIG. 7d illustrates an alternative embodiment of an ion beam focusing apparatus 718, as provided herein, comprising an electrostatic lens. In particular, FIG. 7d illustrates an electrostatic lens comprising a conductive Einzel lens 720 (e.g., single lens electrode) that extends around the ion beam 708, as well as a time-varying power source 704 that provides a time-varying potential to the Einzel lens 720. The Einzel lens 720 may be energized with the time varying-voltage to generate time varying electric fields at the entrance and exit of the Einzel lens 720 to adjust a focal property of the focus adjusted ion beam 708.

Figure 8:
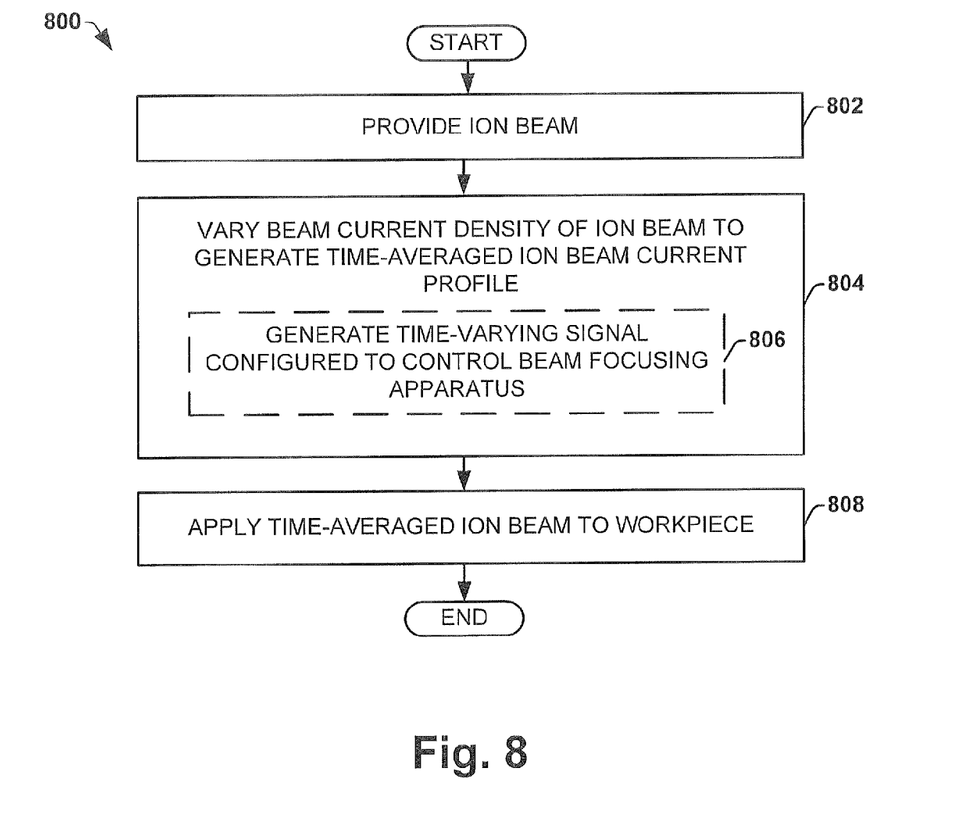
FIG. 8 is a flow chart illustrating a method of improving ion beam current and dose uniformity across a workpiece in a two-dimensional scanning system by changing the beam current density of an ion beam as it is scanned across a workpiece.
Figure 9:
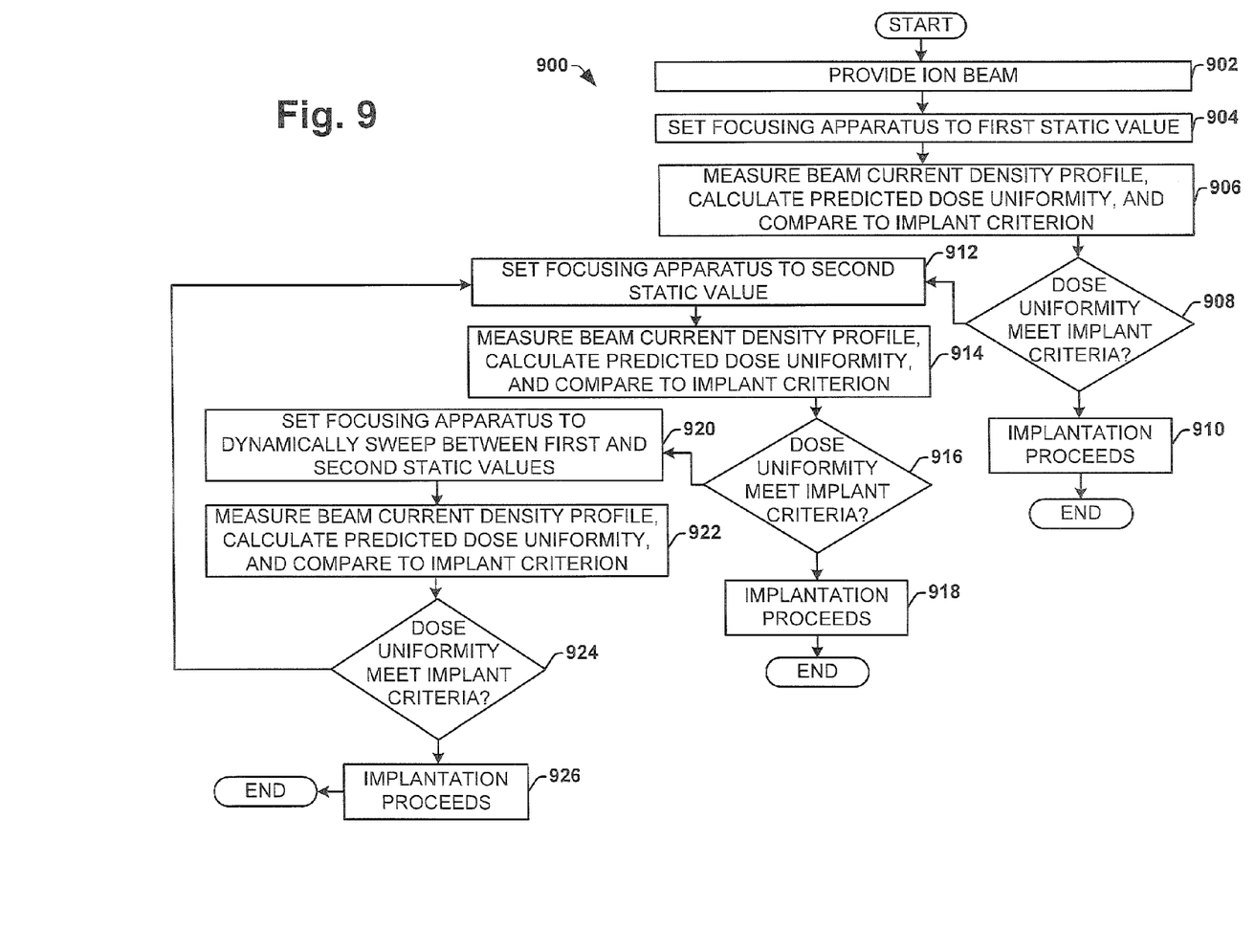
FIG. 9 is a flow chart illustrating a more detailed method of improving ion beam current and dose uniformity across a workpiece in a two-dimensional scanning system by changing the beam current density of an ion beam as it is scanned across a workpiece.

FIGS. 8 and 9 illustrate flow charts 800 and 900 showing methods for the improvement of the dose uniformity of a current implant through varying the beam current density of an ion beam as the beam is scanned across the surface of a workpiece. While these methods 800 and 900 are illustrated and described below as a series of acts or events, the present disclosure is not limited by the illustrated ordering of such acts or events. For example, some acts may occur in different orders and/or concurrently with other acts or events apart from those illustrated and/or described herein. In addition, not all illustrated acts are required and the waveform shapes are merely illustrative and other waveforms may vary significantly from those illustrated. Further, one or more of the acts depicted herein may be carried out in one or more separate acts or phases.

FIG. 8 is a flow chart illustrating a method 800 of improving ion beam current and dose uniformity across a workpiece in a two-dimensional scanning system by changing the beam current density of an ion beam as it is scanned across a workpiece.

At 802 an ion beam is provided. The ion beam may be directed along a beam line toward an end station configured to hold or support a workpiece.

At 804, a time-averaged ion beam current profile is generated by varying the beam current density of an ion beam as the ion beam is scanned over a workpiece. The time-averaged ion beam current profile may be generated by rapidly varying the beam current density of the ion beam in a time-varying manner to obtain a plurality of different beam current densities having different beam current profiles. In one embodiment, the time-averaged beam current profile may be generated by changing the shape of an ion beam between different cross-sectional shapes having different beam current densities. It will be appreciated that by generating a time-averaged ion beam as such, the time averaged beam current has a resultant beam profile that produces a more uniform dose distribution than the beam profile of any of the individual cross-sectional shapes. In one embodiment (shown as block 806), a time-varying voltage, configured to control a beam focusing apparatus, may be generated and provided to one or more beam focusing apparatus to vary the beam current density of an ion beam in the time varying manner.

At 808, the time-averaged ion beam current profile is applied to a workpiece. In one embodiment, the time-averaged ion beam current profile may be applied to a workpiece by directing the ion beam having a rapidly varying cross sectional shape at a workpiece. In one embodiment, applying the time averaged ion beam current profile to a workpiece may comprise moving an end station, configured to hold the workpiece, with respect to the time-averaged ion beam in a two-dimensional manner (e.g., along a fast scan axis having a fast scan direction, and along a slow scan axis having a slow scan direction, substantially orthogonal to the fast scan direction).

FIG. 9 is a flow chart illustrating a more detailed method 900 of improving dose uniformity across a workpiece in a two-dimensional scanning system by changing the beam current density of an ion beam as it is scanned across a workpiece.

At 902 an ion beam is provided. The ion beam may be directed along a beamline toward an end station configured to hold or support the workpiece.

At 904, a focusing apparatus is set to a first static focusing value. In one embodiment, the first static focusing value may correspond to a signal magnitude provided to one or more focusing elements (e.g., a focus voltage). In another embodiment, the first static focusing value may correspond to a focusing strength of one or more focusing elements. The static focusing value results in changes in the beam current density of an ion beam and therefore may provide a smoothing effect on the beam current.

At 906 the beam current density profile of the beam is measured and a predicted dose uniformity is calculated and compared to an implant uniformity criterion. In one embodiment, the beam current density profile is measured in at least the slow scan direction.

Referring to box 908, if the calculated predicted dose uniformity does not violate the implant uniformity criteria (e.g., is not below the implant uniformity criteria) it is acceptable, and the implantation may proceed at 910. If the calculated predicted dose uniformity does violate the implant uniformity criteria (e.g., is below the implant uniformity criteria) it is not acceptable, and the focusing apparatus is adjusted to a different, second static focusing value at 912.

The beam current density profile is again measured, and a second predicted dose uniformity is calculated and compared to the implant uniformity criterion at 914. Referring to box 916, if the second calculated predicted dose uniformity is acceptable, the implantation may proceed at 918. If the second calculated predicted dose uniformity is not acceptable, the focusing element may be set to dynamically vary between the first and second static focusing values at 920.

The beam current density profile is again measured, and a third predicted dose uniformity is calculated and compared to the implant uniformity criterion at 924. Referring to box 924, if the third calculated predicted dose uniformity is acceptable, the implantation may proceed at 926. If the third calculated predicted dose uniformity is not acceptable, the method may proceed to step 912. The process illustrated in method 900 may proceed iteratively, as described above, until an acceptable predicted uniformity is arrived upon.

Although the disclosure has been illustrated and described above with respect to certain aspects and implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary implementations of the disclosure. In this regard, it will also be recognized that the disclosure may include a computer-readable medium having computer-executable instructions for performing the steps of the various methods of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "including", "has", "having", "with" and variants thereof are used in either the detailed description or the claims, these terms are intended to be inclusive in a manner similar to the term "comprising". Also, the term "exemplary" as utilized herein simply means example, rather than finest performer.

What is claimed is:

1. An ion implantation system, comprising:
   a beamline configured to direct an ion beam toward an end station configured to hold one or more workpieces;
   a scanning system configured to scan the ion beam across the workpiece in a fast scan direction and a slow scan direction; and
   a beam focusing apparatus configured to generate the ion beam to have a time-averaged ion beam current profile by continually varying a beam current density of the ion beam between different individual beam current densities respectively having different beam current profiles, as the ion beam moves across the surface of the workpiece during implantation, wherein the time-averaged ion beam current profile has a beam current that is more uniform than the beam current of any of the individual beam current densities.

2. The ion implantation system of claim 1, wherein the frequency of varying the beam current density of the ion beam is substantially greater than a frequency of scanning the ion beam along the fast scan direction.

3. The system of claim 2, wherein the ratio of the frequency of varying the beam current density to the frequency of scanning the ion beam along the fast scan direction is greater than 10.

4. The ion implantation system of claim 1, wherein the beam focusing apparatus comprises one or more beam focusing elements located within an end station, beamline assembly, or terminal and configured to change the beam current density of the ion beam.

5. The ion implantation system of claim 4, wherein the one or more beam focusing elements comprise one or more of: a solenoid disposed around the ion beam, a multipole magnet disposed around the ion beam, a multipole electrostatic lens disposed around the ion beam, a suppression electrode disposed around the ion beam, and an Einzel lens.

6. The ion implantation system of claim 4, further comprising a time-varying power source configured to provide a time-varying signal to the beam focusing apparatus, thereby causing the beam current density of the ion beam to be continuously varied so as to obtain the plurality of different ion beam current densities as the ion beam moves across the surface of the workpiece.

7. The ion implantation system of claim 1, wherein the beam focusing apparatus is configured to iteratively adjust the beam current density of the ion beam until a predicted dose uniformity, calculated from a measured beam current density, does not violate a predetermined implant uniformity criteria.

8. A method for generating an ion beam having a uniform beam current profile, comprising:
   providing an ion beam;
   generating a time-averaged ion beam current profile by using beam focusing methods to rapidly, continually vary a beam current density of an ion beam between different individual beam current densities respectively having different beam profiles, wherein the time-averaged ion beam current has a beam current that is more uniform than the beam current of any of the individual beam current densities; and
   applying the time-averaged ion beam current to a workpiece.

9. The method of claim 8, wherein the frequency of varying the beam current density of the ion beam is substantially greater than a frequency of scanning of the ion beam along a fast scan direction.

10. The method of claim 8, wherein rapidly, continually vary a beam current density of an ion beam comprises continually varying a cross-sectional shape of the ion beam as the ion beam is scanned over a workpiece in a fast scan direction.

11. The method of claim 8, further comprising generating a time-varying signal configured to control a beam focusing apparatus that varies the beam current density of the ion beam in a time varying manner.

* * * * *